US009696368B2

(12) United States Patent
Ohtsuki

(10) Patent No.: US 9,696,368 B2
(45) Date of Patent: Jul. 4, 2017

(54) SEMICONDUCTOR SUBSTRATE EVALUATING METHOD, SEMICONDUCTOR SUBSTRATE FOR EVALUATION, AND SEMICONDUCTOR DEVICE

(71) Applicant: Tsuyoshi Ohtsuki, Gunma (JP)

(72) Inventor: Tsuyoshi Ohtsuki, Gunma (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 216 days.

(21) Appl. No.: 14/404,848

(22) PCT Filed: Apr. 25, 2013

(86) PCT No.: PCT/JP2013/062277
§ 371 (c)(1),
(2) Date: Dec. 1, 2014

(87) PCT Pub. No.: WO2013/187140
PCT Pub. Date: Dec. 19, 2013

(65) Prior Publication Data
US 2015/0145551 A1    May 28, 2015

(30) Foreign Application Priority Data
Jun. 15, 2012 (JP) ................................. 2012-135726

(51) Int. Cl.
*G01R 31/26* (2014.01)
*H01L 21/66* (2006.01)
(Continued)

(52) U.S. Cl.
CPC .......... *G01R 31/2601* (2013.01); *H01L 22/34* (2013.01); *H01L 29/0638* (2013.01); *H01L 29/1095* (2013.01); *H01L 22/14* (2013.01)

(58) Field of Classification Search
CPC .......... H01L 22/34; H01L 27/14; G01R 31/26
See application file for complete search history.

(56) References Cited

U.S. PATENT DOCUMENTS 5,077,226 A   12/1991  Youn et al.
6,924,531 B2   8/2005  Chen et al.
(Continued)

FOREIGN PATENT DOCUMENTS

JP   H06-163844 A   6/1994
JP   H07-201974 A   8/1995
(Continued)

OTHER PUBLICATIONS

Taiwanese Office Action dated Jul. 7, 2015; Application No. 102116137.
(Continued)

*Primary Examiner* — Huy Q Phan
*Assistant Examiner* — Alvaro Fortich
(74) *Attorney, Agent, or Firm* — Arent Fox LLP

(57) ABSTRACT

On an EP substrate 1, an EP layer 2 having a conductivity type different from that of the EP substrate 1 is grown. With ion implantation, a well 5 having the same conductivity type as the EP layer 2 is formed, and a channel stop layer 10 is also formed. A dopant having a conductivity type different from that of the well 5 is diffused in the well 5 to form a pn junction 7 in the well 5. A plurality of cells 20 each having the diffusion layer 6 as one electrode and a rear surface 1a as the other electrode are formed as a TEG. Using the TEG, junction leakage currents from two depletion layers, a depletion layer 8 in the well and a depletion layer 4 at an interface between the EP layer 2 and the EP substrate 1, are measured.

11 Claims, 5 Drawing Sheets

(51) Int. Cl.
  *H01L 29/06*  (2006.01)
  *H01L 29/10*  (2006.01)

(56) References Cited

U.S. PATENT DOCUMENTS

| | | | |
|---|---|---|---|
| 7,868,422 B2 | 1/2011 | Lee et al. | |
| 2004/0119116 A1* | 6/2004 | Byeon | H01L 27/0207 257/335 |
| 2005/0073007 A1 | 4/2005 | Chen et al. | |
| 2005/0095108 A1* | 5/2005 | Hinds | B66C 23/54 414/680 |
| 2007/0108602 A1 | 5/2007 | Lee et al. | |
| 2009/0321786 A1* | 12/2009 | Cheng | H01L 27/14645 257/187 |
| 2010/0140728 A1* | 6/2010 | Banghart | H01L 27/14683 257/431 |
| 2012/0001174 A1* | 1/2012 | Kronholz | H01L 22/12 257/48 |
| 2013/0270557 A1* | 10/2013 | Shiu | H01L 22/34 257/48 |

FOREIGN PATENT DOCUMENTS

| | | |
|---|---|---|
| JP | 3250158 B2 | 11/2001 |
| JP | 2004-039918 A | 2/2004 |
| JP | 2006-310495 | 11/2006 |
| JP | 2011-100909 A | 5/2011 |
| JP | 2011-100964 A | 5/2011 |
| TW | I236138 B | 7/2005 |
| TW | I331400 B | 10/2010 |

OTHER PUBLICATIONS

International Search Report, International Application No. PCT/JP2013/032277, dated Apr. 25, 2013.

\* cited by examiner

FIG.3A  GROWTH OF EP LAYER
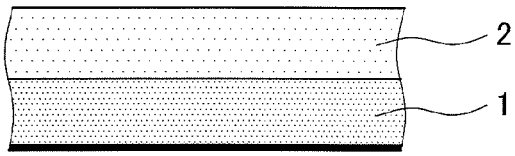
FIG.3B  FORMATION OF MASK OXIDE FILM
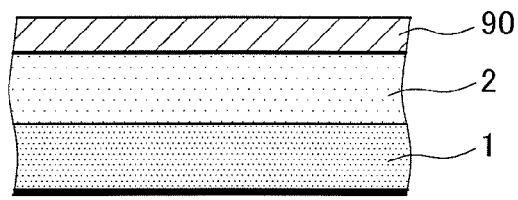
FIG.3C  FORMATION OF WINDOW
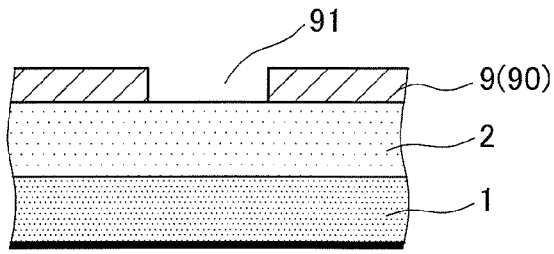
FIG.3D  ION IMPLANTATION
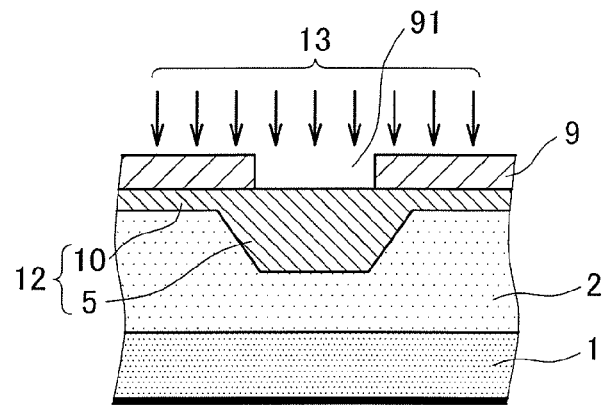
FIG.3E  DIFFUSION OF JUNCTION LAYER
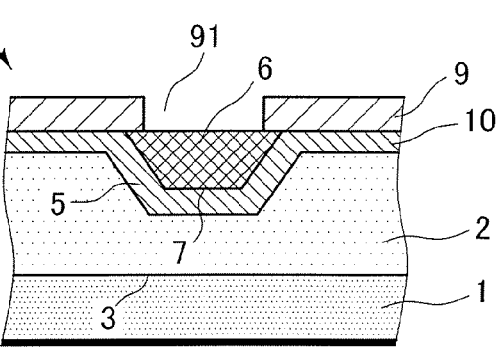

SEMICONDUCTOR SUBSTRATE EVALUATING METHOD, SEMICONDUCTOR SUBSTRATE FOR EVALUATION, AND SEMICONDUCTOR DEVICE

CROSS-REFERENCE TO RELATED APPLICATIONS

This present application is a National Stage entry of International Application No. PCT/JP2013/062277, filed Apr. 25, 2013, which claims priority to Japanese Patent Application No. 2012-135726, filed Jun. 15, 2012. The disclosures of the prior applications are incorporated in their entirety reference.

FIELD OF THE INVENTION

This invention relates to a semiconductor substrate evaluating method, and more particularly, to a method of evaluating electrical characteristics in the vicinity of the surface of a silicon wafer, a semiconductor substrate, and a semiconductor device. In particular, the invention relates to a method of evaluating a junction leakage current of a semiconductor substrate, and a semiconductor substrate and a semiconductor device used for the evaluation method.

BACKGROUND OF THE INVENTION

With increasing miniaturization and sophistication of semiconductor devices such as memories, solid state image sensors such as CCDs, and the like, silicon wafers as materials are also required to have high qualities in order to increase the product yield of the semiconductor devices. Various silicon wafers complying with such requirement have been developed. The quality of a silicon substrate has great influence on solid state image sensors, and crystallinity of a wafer surface portion, which is assumed to have direct influence on product characteristics, is particularly important. Examples of measures that have been developed to improve the surface quality are as follows: 1) high-temperature treatment in an atmosphere containing inert gas or hydrogen, 2) reduction of grown-in defects by improving pulling conditions, 3) epitaxially grown wafers and the like.

In particular, regarding a solid state image sensor, light is caused to enter a semiconductor and converted into an electric signal, and an image is composed from a generated electric signal. Therefore, not only the quality at the uppermost surface but also the quality at a depth of about several microns from the surface is very important.

As a method of evaluating electrical characteristics of surface quality of a silicon wafer, gate oxide integrity (GOI) evaluation has been known. In the gate oxide integrity (GOI) evaluation, a gate oxide film is formed on a silicon surface by thermal oxidation, and an electrode is formed on the gate oxide film to apply electric stress to the silicon oxide film as an insulator. The quality of the silicon surface is evaluated based on the degree of insulation. If defects and/or metal impurities are present on the original silicon surface, they are taken into the silicon oxide film due to the thermal oxidation, resulting in a nonuniform insulator. That is, presence of defects and/or impurities causes a reduction in the insulation property, and therefore, the quality of the silicon surface is evaluated by observing the degree of the reduction in the insulation property.

The GOI evaluation, in actual devices, relates to reliability of gate oxide films of MOSFETs, and various wafers have been developed for improvement of the GOI evaluation. The GOI evaluation has greatly contributed to studies on grown-in defects relating to COP, and improvement of wafers and devices. However, even when no problem occurs in the GOI evaluation, it is naturally possible that device yield is reduced. Especially in recent years, the number of such events is increasing with an increase in integration density of devices. Particularly in a solid state image sensor, it is necessary to reduce a leakage current caused by a wafer, in view of its principle, such as influence of a current spread from a neutral area outside a depletion layer.

Confronting the above problems, development and improvement of silicon wafer substrates are progressed. However, unless devices such as solid state image sensors are actually manufactured in silicon wafer substrates and evaluated, effects thereof cannot be judged. Therefore, with an attention focused on the structure of a photosensitive portion that can be regarded as the heart of a solid state image sensor, a pn junction is formed in a wafer surface, and a leakage current at the pn junction is measured to evaluate the wafer quality (refer to Patent Document 1, for example). Patent Document 1 discloses a structure with a guard ring, as a cell structure in which a leakage current at a pn junction formed in a wafer surface is measured. In this structure, the guard ring is provided on a peripheral portion of the pn junction, and the guard ring separates an area component (composed of a spread current and a generation current) of a leakage current from a peripheral component (surface generation current) of the leakage current. That is, according to this structure, the width of a depletion layer in the peripheral portion of the pn junction is controlled by adjusting a voltage applied to the guard ring, thereby suppressing a leakage current from the peripheral portion.

CITATION LIST

Patent Document

Patent Document 1: Japanese Patent No. 3250158

SUMMARY OF INVENTION

Problems to be Solved by the Invention

In the conventional semiconductor substrate evaluating methods, however, the evaluation region (depth) is, at most, several tens of nanometers from the surface in the GOI evaluation, and about 1 μm in the leakage current measurement. Thus, evaluation reflecting the substrate quality at a deep region cannot be achieved.

This invention has been made in view of the above problems, and an object of this invention is to provide a semiconductor substrate evaluating method, a semiconductor substrate, and a semiconductor device in which leakage current characteristics of a high-quality wafer used for products that are required to have high yield, such as CCDs, CMOS sensors, and the like, can be evaluated with high accuracy.

Solution to the Problems

In order to solve the above problems, a semiconductor substrate evaluating method according to this invention is characterized as follows: on a semiconductor substrate having a first conductivity type, an epitaxial layer having a second conductivity type different from the first conductivity type is grown; a well having the second conductivity type identical to the conductivity type of the epitaxial layer is formed in the epitaxial layer; a channel stop layer is formed at the periphery of a junction of the well; a dopant having the first conductivity type different from the conductivity type of the well is diffused in the well to form a pn junction and one electrode, and a surface of the semiconductor substrate on which no epitaxial layer is grown is regarded as the other electrode, thereby to provide one cell; and using, as a TEG (Test Element Group), a plurality of the cells formed on the semiconductor substrate, junction leakage currents from two depletion layers including a depletion layer formed in the well and a depletion layer formed at an interface between the epitaxial layer and the semiconductor substrate are measured.

According to the evaluation method of this invention, in order to evaluate electrical characteristics of a semiconductor substrate such as a silicon wafer, an epitaxial layer (EP layer) having a conductivity type (the second conductivity type) different from that of the substrate is grown. Thereby, a pn junction is made at an interface between the EP layer and the semiconductor substrate, and a depletion layer is formed due to the pn junction. In addition, a well having the same conductivity type as the EP layer is formed, and a dopant having the first conductivity type different from the conductivity type of the well is diffused in the well to form a pn junction. Thereby, a depletion layer is formed in the well. The diffusion layer formed in the well is regarded as one electrode, and a surface of the semiconductor substrate on which no epitaxial layer is grown is regarded as the other electrode, thereby to provide one cell. Using a TEG (Test Element Group) composed of a plurality of the cells, junction leakage current evaluation is performed. Thus, highly accurate wafer evaluation (leakage current characteristic evaluation) is realized which reflects the wafer quality in a deep region near the interface between the EP layer and the semiconductor substrate as well as the wafer quality in a region near the surface.

Further, in this invention, since a channel stop layer is provided at the periphery of the junction of the well, a parasitic depletion capacitance is prevented from occurring in the vicinity of the junction of the well due to influence of a separation oxide film, surface/interface state, or the like. Thus, when a junction leakage current is measured, a leakage current (peripheral component) from the periphery of the well is prevented from being measured.

Further, in this invention, after the epitaxial layer grown on the semiconductor substrate, a separation oxide film having a window portion is formed on the epitaxial layer, the well is formed by ion implantation in a region directly beneath the window portion, and the channel stop layer is formed with a dopant implanted by the ion implantation to a region directly beneath the separation oxide film. Thus, both the well and the channel stop layer can be formed in the same process (ion implantation process), thereby simplifying the manufacturing process.

Further, when the well of this invention is formed, ion implantation is directly performed without forming an oxide film other than the separation oxide film. In the ion implantation, a dosage is controlled within a range which does not cause a defect that adversely affects a GOI (Gate Oxide Integrity).

In general, before ion implantation to form a well, a thin screen oxide film (thermal oxide film) is formed in a region other than a separation oxide film as described in Japanese Laid-Open Patent Publications Nos. 6-163844 and 7-201974. In contrast, according to this invention, since ion implantation is directly performed without forming a thermal oxide film (screen oxide film) before the ion implantation. Thus, a process of forming a screen oxide film can be omitted, and wafer evaluation can be performed in a state where a defect caused by the ion implantation (a defect that adversely affects the GOI) is avoided.

Further, in this invention, the area of the electrode on the well is preferably not larger than 4 $mm^2$. Thus, position resolution is maintained high when the junction leakage current is measured, and the value of the measured leakage current is prevented from being excessively large.

Further, in this invention, preferably, the well has a dopant concentration ranging from $1 \times 10^{16}$ atoms/$cm^3$ to $1 \times 10^{17}$ atoms/$cm^3$ and a depth not larger than 2 μm, the diffusion layer formed in the well has a dopant concentration ranging from $1 \times 10^{18}$ atoms/$cm^3$ to $5 \times 10^{20}$ atoms/$cm^3$ and a depth not larger than 1 μm, and the channel stop layer has a dopant concentration ranging from $1 \times 10^{16}$ atoms/$cm^3$ to $1 \times 10^{17}$ atoms/$cm^3$ and a depth not larger than 0.5 μm. According to the knowledge of the inventors, these numerical ranges realize highly accurate measurement of junction leakage current.

A semiconductor substrate for evaluation according to this invention is characterized as follows: on a semiconductor substrate having a first conductivity type, an epitaxial layer having a second conductivity type different from the first conductivity type is grown; a well having the second conductivity type identical to the conductivity type of the epitaxial layer is formed in the epitaxial layer; a channel stop layer is formed at the periphery of a junction of the well; a dopant having the first conductivity type different from the conductivity type of the well is diffused in the well to form a pn junction and one electrode, and a surface of the semiconductor substrate on which no epitaxial layer is grown is regarded as the other electrode, thereby to provide one cell; and a plurality of the cells are formed on the semiconductor substrate to be used as a TEG (Test Element Group). According to the semiconductor substrate for evaluation, the same effects as those of the semiconductor substrate evaluating method of this invention are achieved.

A semiconductor device according to this invention is characterized as follows: on a semiconductor substrate having a first conductivity type, an epitaxial layer having a second conductivity type different from the first conductivity type is grown; a well having the second conductivity type identical to the conductivity type of the epitaxial layer is formed in the epitaxial layer; a channel stop layer is formed at the periphery of a junction of the well; and a dopant having the first conductivity type different from the conductivity type of the well is diffused in the well to form a pn junction and one electrode, and a surface of the semiconductor substrate on which no epitaxial layer is grown is regarded as the other electrode, thereby to provide one cell. According to the semiconductor device, the same effects as those of the semiconductor substrate evaluating method of this invention are achieved.

As described above, according to this invention (the semiconductor substrate evaluating method, the semiconductor substrate for evaluation, and the semiconductor device), it is possible to easily and accurately evaluate leakage current characteristics of high-quality wafers used for products that are required to have high yield, such as CCDs, CMOS sensors, and the like.

BRIEF DESCRIPTION OF THE DRAWINGS

FIG. 3A is a diagram showing an EP layer growth step in a cell manufacturing process.

FIG. 3B is a diagram showing a mask oxide film forming step in the cell manufacturing process.

FIG. 3C is a diagram showing a window forming step in the cell manufacturing process.

FIG. 3D is a diagram showing an ion implanting step in the cell manufacturing process.

FIG. 3E is a diagram showing a junction layer diffusing step in the cell manufacturing process.

DESCRIPTION OF EMBODIMENTS

Figure 1:
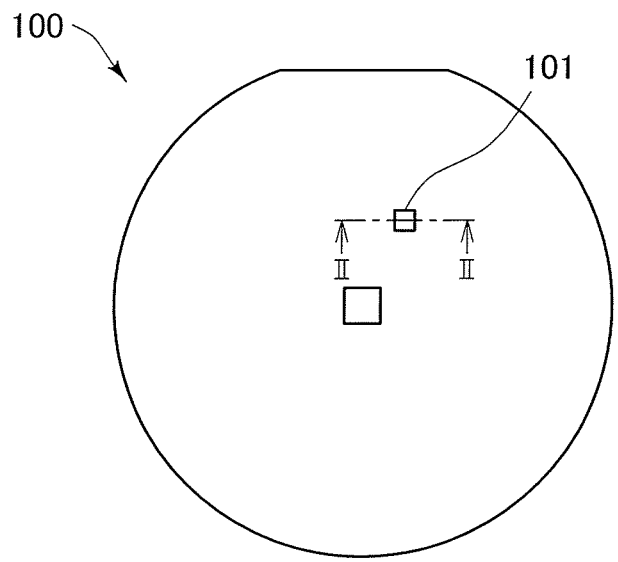
FIG. 1 is a plan view of a silicon wafer 100.
Figure 2:
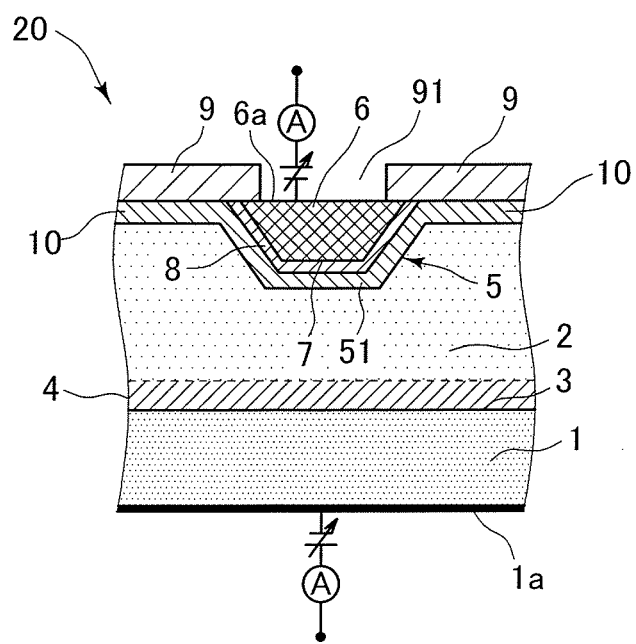
FIG. 2 is a diagram schematically showing a cross-sectional structure of a cell 20.
Figure 7:
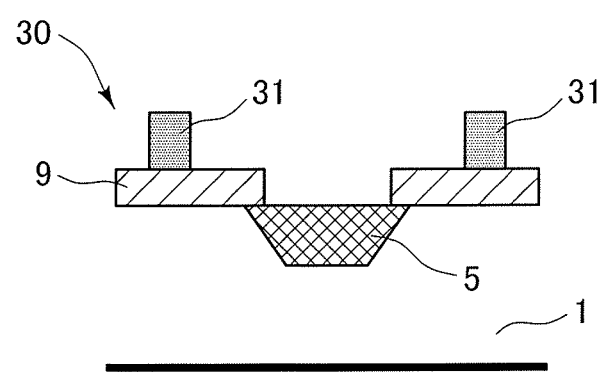
FIG. 7 is a diagram showing a cell 30 with a guard ring 31 according to a conventional art.

Hereinafter, an embodiment of this invention will be described with reference to the drawings. FIG. 1 is a plan view of a silicon wafer 100 as a semiconductor substrate for evaluation according to this invention. FIG. 2 is a cross-sectional view taken along a line II-II at a portion 101 shown in FIG. 1. FIG. 2 shows a junction structure (cross-sectional structure) of a cell 20 for measuring a junction leakage current, as a semiconductor device of this invention. FIG. 7 shows a junction structure (a structure with a guard ring 31) of a cell 30 according to the conventional art (Japanese Patent No. 3250158). The cell 20 shown in FIG. 2 is formed in a plurality of portions within the surface of the silicon wafer 100 shown in FIG. 1. The plurality of cells 20 constitute a TEG (Test Element Group) for evaluating the quality of the silicon wafer 100. The portion 101 shown in FIG. 1 is a portion arbitrarily selected from among the plurality of portions in which the cells 20 are formed. A major difference between the junction structure of the cell 20 shown in FIG. 2 and the conventional junction structure 30 (refer to FIG. 7) is that the cell 20 includes two depletion layers respectively provided in the vicinity of the surface and at an interface between an EP layer and an EP substrate. Hereinafter, the junction structure of the cell 20 will be described in detail.

The cell 20 shown in FIG. 2 is structured so as to include an EP substrate 1, an epitaxial layer (EP layer) 2 formed on the EP substrate 1, a well 5 formed in the vicinity of the surface of the EP layer 2, a diffusion layer 6 formed in the well 5, and a channel stop layer 10 formed directly beneath a separation oxide film 9 at the periphery of the junction of the well 5. The cell 20 is characterized in that, first, the conductivity types of the EP substrate 1 and the EP layer 2 are made different from each other. That is, the EP layer 2 and the EP substrate 1 have different conductivity types. Therefore, at an interface 3 between the EP substrate 1 and the EP layer 2, a pn junction is formed, and the pn junction causes a depletion layer 4. In addition, the EP layer 2 has a dopant concentration lower than that of the EP substrate 1. Thus, the depletion layer 4 can be expanded to the EP layer 2 side. As a result, it becomes possible to evaluate the quality of the EP layer 2.

The well 5 is formed directly beneath a window portion 91 of the separation oxide film 9. The well 5 has the same conductivity type as the EP layer 2. The concentration of the well 5 (well concentration) is one of features of the cell 20. That is, the concentration of the well 5 ranges from $1\times10^{16}$ atoms/cm$^3$ to $1\times10^{17}$ atoms/cm$^3$. Particularly when the well 5 is formed by ion implantation of boron, if the concentration of the well 5 is excessively high, dislocations are formed by the ion implantation, and defects are easily formed in the well 5. Of course, if the concentration is excessively low, it becomes difficult to perform stable measurement of leakage current due to influence of the original substrate resistance (the resistance of the EP substrate 1). When the well concentration is within the range discovered by the inventors of this invention, no dislocations occur and thus stable measurement is realized. Preferably, the well 5 has a depth not larger than 2 μm.

The separation oxide film 9 is an oxide film formed on the EP layer 2 (on the diffusion layer 6 and the channel stop layer 10, exactly) to insulate and separate the cell 20 from other cells. The thickness of the separation oxide film 9 is set by taking into consideration the channel stop layer 10 described later.

The diffusion layer 6 is a layer which is formed in the well 5 (formed over a range from the surface of the well 5 to a certain depth in the well 5) and in which a dopant having a conductivity type different from that of the well 5 is diffused. Since the well 5 (a portion of the well 5 other than the diffusion layer 6) and the diffusion layer 6 have different conductivity types, a pn junction is formed at an interface 7 between them. Therefore, in the well 5, a depletion layer 8 is formed by the pn junction 7. The dopant concentration of the diffusion layer 6 is preferably in a range from $1\times10^{18}$ atoms/cm$^3$ to $5\times10^{20}$ atoms/cm$^3$. In addition, the depth of the diffusion layer 6 is preferably not larger than 1 μm. By setting the dopant concentration and the depth of the diffusion layer 6 within the above ranges, it is possible to set the depletion layer 8 suitable for junction leakage current measurement. In the following description, a portion of the well 5 other than the diffusion layer 6 is designated by reference numeral "51", and the portion designated by "51" is referred to as a non-diffusion layer.

The diffusion layer 6 is used as one electrode of the cell 20. The area of the diffusion layer 6 as the electrode (the area of the pn junction 7) is preferably not larger than 10 mm$^2$, and more preferably, not larger than 4=$^2$. When the electrode area exceeds 4 mm$^2$, position resolution is degraded when the leakage current is measured, and thereby the value of the leakage current may be excessively large. As a result, hardly any difference is generated between the leakage current obtained when the wafer quality is low and the leakage current obtained when the wafer quality is high. On the other hand, if the electrode area is excessively small, the value of the leakage current may be excessively small, and it becomes difficult to accurately determine whether the wafer quality is high or low. Therefore, the lower limit of the electrode area is appropriately set so that the value of the leakage current is not excessively small.

The channel stop layer 10 is formed at the periphery of the junction of the well 5 (around a peripheral portion of the pn junction 7). In other words, the channel stop layer 10 is formed directly beneath the separation oxide film 9. The channel stop layer 10 is a layer containing the same dopant as the non-diffusion layer 51, that is, having the same conductivity type as the non-diffusion layer 51. The dopant concentration of the channel stop layer 10 is preferably in a range from $1\times10^{16}$ atoms/cm$^3$ to $1\times10^{17}$ atoms/cm$^3$. The depth of the channel stop layer 10 is preferably not larger than 0.5 μm. The channel stop layer 10 prevents a parasitic depletion capacitance from occurring in the vicinity of the well 5 due to influence of the separation oxide film 9, surface/interface state, or the like. As a result, when the junction leakage current is measured, the leakage current (peripheral component) from the periphery of the well 5 is prevented from being measured. Further, by setting the dopant concentration and the depth of the channel stop layer 10 within the above ranges, it is possible to prevent occurrence of defects which may adversely affect the GOI (Gate Oxide Integrity) during ion implantation for forming the channel stop layer 10 described later.

The cell 20 having the above-described structure is used for junction leakage current measurement, with the diffusion layer 6 being used as one electrode as described above, and a surface 1a of the EP substrate 1 on which no EP layer 2 is grown (hereinafter referred to as a rear surface) being used as the other electrode. Specifically, a reverse bias voltage of the same potential is applied to the front surface 6a side and the rear surface 1a side (a reverse bias voltage is applied to the pn junctions 7 and 3). Then, currents flowing in the terminals of the front surface 6a and the rear surface 1a are monitored as junction leakage currents flowing in the two depletion layers 4 and 8 (generated and recombined currents in the depletion layers), respectively. According to the structure of this invention, it is possible to measure the qualities of two depletion layers, that is, the depletion layer 8 located near the front surface 6a, and the depletion layer 4 located at the interface between the EP layer 2 and the EP substrate 1, deeper than the depletion layer 8. Accordingly, it is possible to accurately evaluate the silicon wafer 100.

Next, a method of manufacturing the cell 20 will be described. FIGS. 3A to 3E are flowcharts showing an example of a process of manufacturing the cell 20. First, the EP layer 2 is epitaxially grown on the EP substrate 1 (EP layer growth step of FIG. 3A). The EP substrate 1 and the EP layer 2 are regarded as an evaluation target substrate to be subjected to quality evaluation. Next, a mask oxide film 90 serving as a mask is formed on the evaluation target substrate (on the EP layer 2) (mask oxide film forming step of FIG. 3B). The mask oxide film 90 may be formed by thermal oxidation or CVD, but the following point should be noted. That is, the thickness of the mask oxide film 90 should be set so that, in the subsequent ion implantation for forming a well, the ion slightly exceeds the mask oxide film 90 and forms the channel stop layer. This thickness depends on an element composing the ion and/or the ion implantation condition (accelerating voltage or the like), and therefore, should take a value suitable for the process and/or the facility.

Next, the mask oxide film 90 is subjected to photolithography and dry etching or wet etching to form a window in the mask oxide film 90 (window forming step of FIG. 3C). The window portion 91 thus formed corresponds to the junction area (electrode area) of the pn junction 7 shown in FIG. 2. Therefore, the area of the window portion 91 is set so that the junction area is desirably not larger than 4 mm$^2$. A portion of the mask oxide film 90 other than the window portion 91 is the separation oxide film 9.

Next, ion 13 (dopant) having the same conductivity type as the EP layer 2 is implanted into the EP layer 2 by ion implantation (ion implanting step of FIG. 3D). At this time, an ion-implanted layer 12 is formed beneath the window portion 91 and the separation oxide film 9. Of the ion-implanted layer 12, a layer 5 formed directly beneath the window portion 91 acts as a well, and a layer 10 formed directly beneath the separation oxide film 9 acts as a channel stop layer. The well 5 corresponds to the well before formation of the diffusion layer 6 shown in FIG. 2. The channel stop layer 10 is formed by the ion 13 passing through the separation oxide film 9, that is, formed by utilizing cell alignment. Further, in the step of FIG. 3D, the ion implantation is directly performed without an oxide film other than the separation oxide film 9 (such as a thermal oxide film for a screen oxide film) being formed. Thus, the manufacturing process can be simplified. In the ion implantation, the dosage is set within a range which does not cause defects that may adversely affect the GOI (Gate Oxide Integrity), that is, within the above-described preferable range (from $1\times10^{16}$ atoms/cm$^3$ to $1\times10^{17}$ atoms/cm$^3$) of the dopant concentration of the well 5. Further, in the ion implantation, the accelerating voltage is set so that the channel stop layer 10 can be formed, taking into consideration the thickness of the separation oxide film 9, and the like. The ion implantation is followed by recovery annealing.

Next, in order to form a pn junction in the well 5, an element having a conductivity type different from that of the well 5 is diffused to form the diffusion layer 6 (diffusion step of FIG. 3E). This diffusion may be ion implantation or application diffusion. However, when ion implantation is adopted, a recovery heat treatment for the ion implantation of FIG. 3E and a recovery heat treatment (recovery annealing) for the ion implantation of FIG. 3D may be combined. Through the above steps, the cell 20 (refer to FIG. 3E) having the pn junctions 3 and 7 at two positions is completed.

Example 1

The following experiment was performed for confirming the effect of this invention. It is noted that this invention is not limited to the following example. A boron-doped silicon wafer having a diameter of 200 mm and a resistivity of 10 Ω·cm (corresponding to the EP substrate 1 shown in FIG. 2) was used as a material. First, the wafer was put in an epitaxial reactor in which presence of heavy metal contamination has already been known, and a phosphorus-doped EP layer was grown thereon. At this time, the EP layer had a thickness of 10 μm, and a resistivity of 10 Ω·cm. This wafer was subjected to a Pyro atmosphere at 1000° C. for 90 minutes to form an oxide film having a thickness of 200 nm thereon. Thereafter, a photoresist was applied, and photolithography was performed. A negative photoresist was selected this time. Apertures of various areas were prepared in the mask so as to enable measurement of area-dependency of junction leakage. In addition, apertures having the same area and different peripheral lengths were also prepared. The wafer with the photoresist was subjected to oxide film etching in a buffered HF solution. Then, the photoresist was removed in a mixed solution of sulfuric acid and hydrogen peroxide, followed by RCA cleaning. Boron was ion-implanted into this wafer at an accelerating voltage of 55 KeV and a dosage of $2\times10^{12}$ atoms/cm$^2$, thereby forming a well and a channel stop layer. The dosage of $2\times10^{12}$ atoms/cm$^2$ was a dosage at which the peak concentration of the well becomes $1\times10^{17}$ atoms/cm$^3$. Thereafter, recovery annealing was performed under a nitrogen gas atmosphere at 1000° C.

Then, phosphorus glass was applied and diffused to make phosphorus diffuse from the surface. Thus, a pn junction was formed in the well.

Figure 4A:
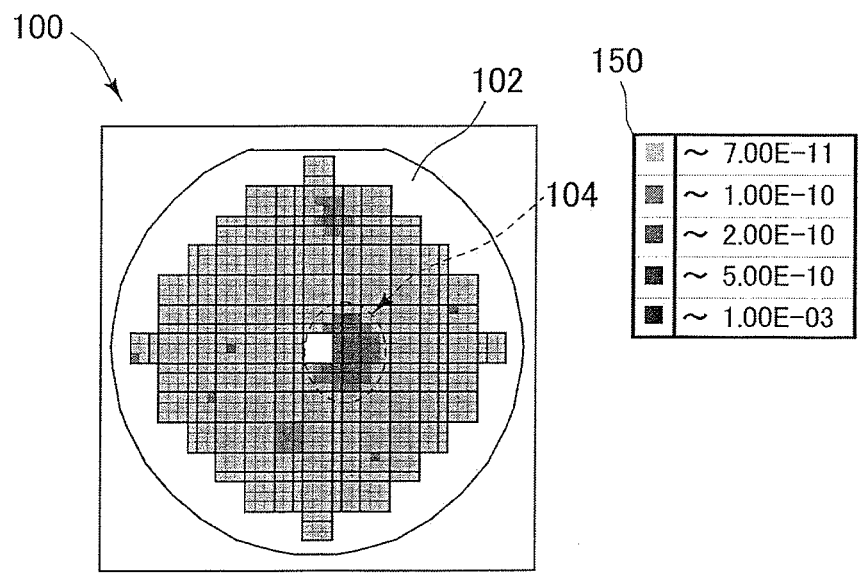
FIG. 4A is a diagram showing a leakage current measurement result on a front surface side of a structure according to Example 1.
Figure 4B:
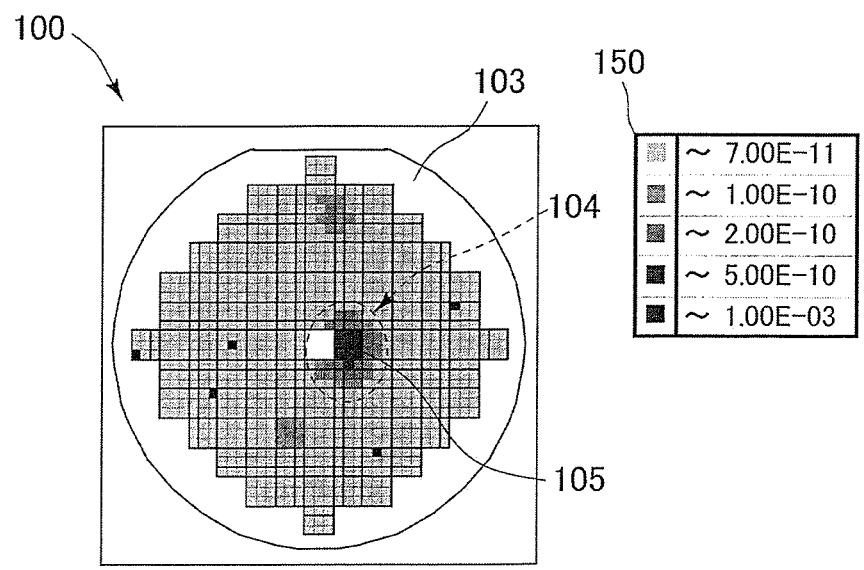
FIG. 4B is a diagram showing a leakage current measurement result on a rear surface side of the structure according to Example 1.

FIGS. 4A and 4B show leakage current measurement results (leakage current distribution results) of this structure. FIG. 4A shows a result of leakage current measurement in which a reverse bias voltage of 3 V is applied to an electrode on a surface 102 of the wafer 100 of this invention (the electrode on the well 5 side in FIG. 2), and a leakage current flowing in the electrode on the well 5 side is measured. FIG. 4B shows a result of leakage current measurement in which a reverse bias voltage of 3 V is applied to an electrode on a rear surface 103 of the wafer 100 (the rear surface 1a of the EP substrate 1 in FIG. 2), and a leakage current flowing in the electrode on the rear surface 1a is measured. Each of FIGS. 4A and 4B shows a lattice pattern in which the cell 20 (refer to FIG. 2) is formed in each lattice, and a leakage current is measured for each lattice. In FIGS. 4A and 4B, the magnitude of the leakage current is represented by color density. The higher the color density is, the larger the leakage current is.

In FIG. 4A, the leakage current from the depletion layer 8 (refer to FIG. 2) in the well 5 is observed, while in FIG. 4B, the leakage current from the depletion layer 4 (refer to FIG. 2) at the interface between the EP layer 2 and the EP substrate 1 is observed. When FIGS. 4A and 4B are compared, a difference is seen in a region 104 near the center of the wafer 100. Specifically, as compared to the region 104 in FIG. 4A, the region 104 in FIG. 4B includes a region 105 (dark region) where the leakage current is increased. Therefore, it can be said that, in FIG. 4B, defects (heavy metal contamination of the EP layer) in a deep region from the surface of the wafer 100 (in the vicinity of the interface between the EP layer 2 and the EP substrate 1) are successfully captured.

As described above, according to the structure of Example 1, it is possible to evaluate the quality of the region in the vicinity of the surface of the wafer 100 and the quality of the deep region from the surface of the wafer 100. In addition, since a brightest-color portion 150 in the ranges shown in FIGS. 4A and 4B is 7.00E-11, it is found that the structure of Example 1 enables measurement of junction leakage current at picoampere (pA) level.

Comparative Example 1

For the purpose of comparison with this invention, a cell structure for leakage current measurement was manufactured as described below. A boron-doped silicon wafer having a diameter of 200 mm and a resistivity of 10 Ω·cm was used as a material. First, the wafer was put in an epitaxial reactor in which presence of heavy metal contamination has already been known, and a boron-doped EP layer was grown thereon. That is, the silicon wafer (EP substrate) and the EP layer have the same conductivity type. With manufacturing conditions other than above being the same as those of Example 1, a cell structure was manufactured which has no depletion layer 4 at the interface between the EP layer 2 and the EP substrate 1 in the structure of FIG. 2.

Figure 5:
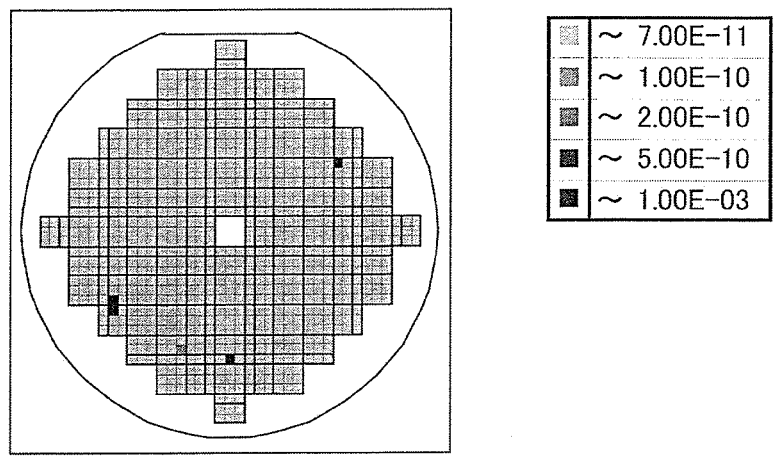
FIG. 5 is a diagram showing a leakage current measurement result of a structure according to Comparative Example 1.

FIG. 5 shows a leakage current measurement result of this structure. Characteristic distribution that seems to be caused by contamination was not obtained in the wafer surface. That is, in the structure of Comparative Example 1, heavy metal contamination in the EP layer cannot be successfully captured.

Comparative Example 2

Next, as Comparative Example 2, a structure having no channel stop layer 10 shown in FIG. 2 (other components are identical to those of the structure shown in FIG. 2) was manufactured. Specifically, a boron-doped silicon wafer having a diameter of 200 mm and a resistivity of 10 Ω·cm was used as a material. First, the wafer was put in an epitaxial reactor in which presence of heavy metal contamination has already been known, and a phosphorus-doped EP layer was grown thereon. At this time, the EP layer had a thickness of 10 μm, and a resistivity of 10 Ω·cm. Next, this wafer was subjected to a Pyro atmosphere at 1000° C. for 300 minutes to form an oxide film having a thickness of 800 nm. That is, the oxide film of Comparative Example 2 is thicker than that in Example 1. Thereafter, a photoresist was applied, and photolithography was performed. The wafer with the photoresist was subjected to oxide film etching in a buffered HF solution. Then, the photoresist was removed in a mixed solution of sulfuric acid and hydrogen peroxide, followed by RCA cleaning. Then, boron was ion-implanted into this wafer at an accelerating voltage of 55 KeV and a dosage of $2 \times 10^{12}$ atoms/cm$^2$. With the accelerating voltage, boron cannot pass through the 800 nm thick oxide film, and therefore, no channel stop layer is formed at the periphery of the junction. Thereafter, recovery annealing was performed under a nitrogen gas atmosphere at 1000° C. Then, phosphorus glass was applied and diffused to make phosphorus diffuse from the surface. Thus a junction was formed.

Figure 6:
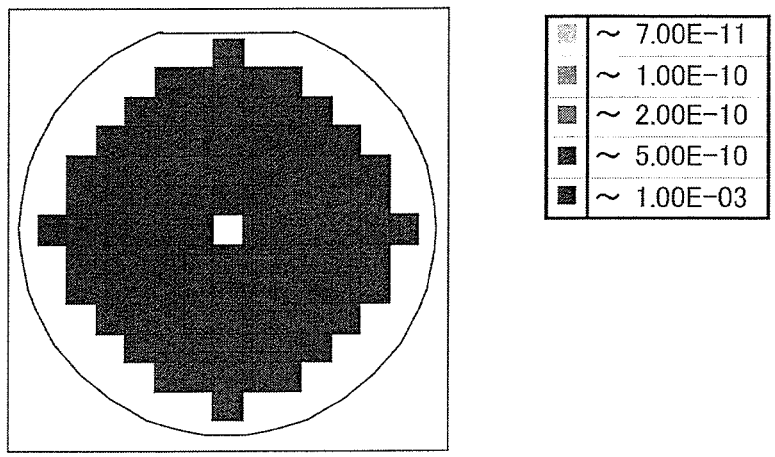
FIG. 6 is a diagram showing a leakage current measurement result of a structure according to Comparative Example 2.

FIG. 6 shows a leakage current measurement result of this structure. The absence of a channel stop layer causes the leakage current level to be high as a whole. Thus, it is found that this structure is not suitable for evaluation.

As described above, according to the cell of this embodiment and the silicon wafer which includes a plurality of the cells formed therein and is used as a TEG, it is possible to measure the leakage currents from the two depletion layers respectively formed in a region near the surface of the wafer and a deep region from the surface. Accordingly, it is possible to evaluate the wafer quality in the deep region from the surface of the silicon wafer 100 as well as the wafer quality in the region near the surface.

The semiconductor substrate evaluating method, the semiconductor substrate for evaluation, and the semiconductor device according to this invention are not limited to those of the above embodiment, and various modifications can be made without departing from the scope of the claims. For example, while in Example 1 the EP substrate is of p type and the EP layer is of n type, the EP substrate may be of n type and the EP layer may be of p type.

DESCRIPTION OF THE REFERENCE CHARACTERS

1 EP substrate (semiconductor substrate)
2 EP layer (epitaxial layer)
3, 7 pn junction
4, 8 depletion layer
5 well
6 diffusion layer
9 separation oxide film
10 channel stop layer
20 cell (semiconductor device)
100 silicon wafer (semiconductor substrate for evaluation)

The invention claimed is:
1. A semiconductor substrate evaluating method, wherein on a semiconductor substrate having a first conductivity type, an epitaxial layer having a second conductivity type different from the first conductivity type is grown, a well having the second conductivity type identical to the conductivity type of the epitaxial layer is formed in the epitaxial layer, a channel stop layer is formed at the periphery of a junction of the well, a dopant having the first conductivity type different from the conductivity type of the well is diffused in the well to form a pn junction and one electrode, and a surface of the semiconductor substrate on which no epitaxial layer is grown is regarded as the other electrode, thereby to provide one cell, and using, as a TEG (Test Element Group), a plurality of the cells formed on the semiconductor substrate, junction leakage currents from two depletion layers including a depletion layer formed in the well and a depletion layer formed at an interface between the epitaxial layer and the semiconductor substrate are measured.

2. The semiconductor substrate evaluating method according to claim 1, wherein after the growth of the epitaxial layer on the semiconductor substrate, a separation oxide film having a window portion is formed on the epitaxial layer, the well is formed by ion implantation in a region directly beneath the window portion, and the channel stop layer is formed with a dopant implanted by the ion implantation to a region directly beneath the separation oxide film.

3. The semiconductor substrate evaluating method according to claim 2, wherein when the well is formed, the ion implantation is directly performed without forming an oxide film other than the separation oxide film, and in the ion implantation, a dosage is controlled within a range which does not cause a defect that adversely affects a GOI (Gate Oxide Integrity).

4. The semiconductor substrate evaluating method according to claim 1, wherein the electrode on the well has an electrode area not larger than 4 mm$^2$.

5. The semiconductor substrate evaluating method according to claim 1, wherein the well has a dopant concentration ranging from $1\times10^{16}$ atoms/cm$^3$ to $1\times10^{17}$ atoms/cm$^3$ and a depth not larger than 2 μm, the diffusion layer formed in the well has a dopant concentration ranging from $1\times10^{18}$ atoms/cm$^3$ to $5\times10^{20}$ atoms/cm$^3$ and a depth not larger than 1 μm, and the channel stop layer has a dopant concentration ranging from $1\times10^{16}$ atoms/cm$^3$ to $1\times10^{17}$ atoms/cm$^3$ and a depth not larger than 0.5 μm.

6. A semiconductor substrate for evaluation, wherein on a semiconductor substrate having a first conductivity type, an epitaxial layer having a second conductivity type different from the first conductivity type is grown, a well having the second conductivity type identical to the conductivity type of the epitaxial layer is formed in the epitaxial layer, a channel stop layer is formed at the periphery of a junction of the well, a dopant having the first conductivity type different from the conductivity type of the well is diffused in the well to form a pn junction and one electrode, and a surface of the semiconductor substrate on which no epitaxial layer is grown is regarded as the other electrode, thereby to provide one cell, and a plurality of the cells are formed on the semiconductor substrate to be used as a TEG (Test Element Group).

7. The semiconductor substrate for evaluation according to claim 6, wherein the electrode on the well has an electrode area not larger than 4 mm$^2$.

8. The semiconductor substrate for evaluation according to claim 6, wherein the well has a dopant concentration ranging from $1\times10^{16}$ atoms/cm$^3$ to $1\times10^{17}$ atoms/cm$^3$ and a depth not larger than 2 μm, the diffusion layer formed in the well has a dopant concentration ranging from $1\times10^{18}$ atoms/cm$^3$ to $5\times10^{20}$ atoms/cm$^3$ and a depth not larger than 1 μm, and the channel stop layer has a dopant concentration ranging from $1\times10^{16}$ atoms/cm$^3$ to $1\times10^{17}$ atoms/cm$^3$ and a depth not larger than 0.5 μm.

9. A semiconductor device, wherein on a semiconductor substrate having a first conductivity type, an epitaxial layer having a second conductivity type different from the first conductivity type is grown, a well having the second conductivity type identical to the conductivity type of the epitaxial layer is formed in the epitaxial layer, a channel stop layer is formed at the periphery of a junction of the well, and a dopant having the first conductivity type different from the conductivity type of the well is diffused in the well to form a pn junction and one electrode, and a surface of the semiconductor substrate on which no epitaxial layer is grown is regarded as the other electrode, thereby to provide one cell.

10. The semiconductor device according to claim 9, wherein the electrode on the well has an electrode area not larger than 4 mm$^2$.

11. The semiconductor device according to claim 9, wherein the well has a dopant concentration ranging from $1\times10^{16}$ atoms/cm$^3$ to $1\times10^{17}$ atoms/cm$^3$ and a depth not larger than 2 μm, the diffusion layer formed in the well has a dopant concentration ranging from $1\times10^{18}$ atoms/cm$^3$ to $5\times10^{20}$ atoms/cm$^3$ and a depth not larger than 1 μm, and the channel stop layer has a dopant concentration ranging from $1\times10^{16}$ atoms/cm$^3$ to $1\times10^{17}$ atoms/cm$^3$ and a depth not larger than 0.5 μm.

* * * * *